United States Patent [19]

Puisais et al.

[11] Patent Number: 4,638,142

[45] Date of Patent: Jan. 20, 1987

[54] MACHINE FOR ELECTRON-BEAM INTERNAL BUTT WELDING OF TUBES

[75] Inventors: Xavier F. Puisais, Levallois Perret; Jean-Pierre Hamon, Cergy; Michel Jégousse, Saint-Herblain; Michel Kaluszynski, Vitry-su-Seine, all of France

[73] Assignee: TOTAL Compagnie Francaise des Petroles, Paris, France

[21] Appl. No.: 785,699

[22] Filed: Oct. 9, 1985

[30] Foreign Application Priority Data

Oct. 22, 1984 [FR] France .................. 84 16114

[51] Int. Cl.⁴ ............................................. B23K 15/00
[52] U.S. Cl. ..................... 219/121 EC; 219/121 ES; 250/396 ML
[58] Field of Search ................. 219/121 EC, 121 ED, 219/121 ER, 121 ES, 121 EU, 121 EV; 250/396 R, 396 ML

[56] References Cited

U.S. PATENT DOCUMENTS 3,454,740 7/1969 Foulquier et al. ........... 219/121 EC
3,535,489 10/1970 Hinrichs ....................... 219/121 EC

FOREIGN PATENT DOCUMENTS 0147856 9/1982 Japan .......................... 250/396 ML Primary Examiner—C. L. Albritton
Attorney, Agent, or Firm—Sughrue, Mion, Zinn, Macpeak and Seas

[57] ABSTRACT

A machine for the internal butt welding of two tubes comprises a fixed axial electron gun, a rotary prism system for radially deflecting the electron beam and comprising a plurality of prisms and a deflection system for cyclically delivering the electron beam emitted by the electron gun successively to each of the prisms at a high frequency, the relative duration of utilization of each prism being modifiable in the course of the rotation of the rotary system.

4 Claims, 7 Drawing Figures

| | X | Y |
|---|---|---|
| $P_1$ | -1 | -1 |
| $P_2$ | -1 | +1 |
| $P_3$ | +1 | +1 |
| $P_4$ | +1 | -1 |

MACHINE FOR ELECTRON-BEAM INTERNAL BUTT WELDING OF TUBES

The present invention relates to an electronbeam welding machine intended to be disposed inside tubes placed end-to-end for the purpose of joining them by welding.

A first known method consists in turning, in a transverse plane relative to the axis of the tubes, an electron gun emitting a radially directed electron beam which thus sweeps the entire internal circumference of the annular surface of contact of the two tubes to be joined together.

In order to avoid having to rotate the heavy, cumbersome apparatus forming the electron gun, it is also possible to hold the electron gun in a fixed axial position and to rotate a prism which deflects the axial electron beam so as to provide a radial electron beam which sweeps the entire internal circumference of the annular surface of contact of the two tubes to be joined together. This rotation of the prism through 360° constitutes a fairly lengthy operation, and it would be very advantageous to be able to shorten it when numerous welding operations have to be carried out in succession, particularly when these operations entail the utilization of expensive associated equipment, as is the case in the butt welding of a new section of pipe to a length of submarine pipe in the course of laying, for example S laying, from a laying barge.

According to the invention there is provided a machine for the electron-beam internal welding of two tubes disposed coaxially end-to-end comprising a fixed electron gun for emitting an axial electron beam, deflection means for deflecting the electron beam in the radial direction, and a rotatable support carrying the deflection means and adapted to rotate about an axis coinciding with that of the electron beam, wherein said rotatable support carries a number n, which is at least equal to two, of said deflection means arranged so as to deflect the electron beam in different radial directions spaced 360/n degrees apart, and, upstream of the deflection means, a deflection system adapted to deliver in a cycle the axial electron beam emitted by the electron gun successively to each of the n deflection means, at a high rate.

This rate may correspond to a frequency of the cycle in which the electron beam is delivered to each of the n deflection means of at least one thousand cycles per second.

The deflection system may comprise at least one deflection coil and supply conductors for supplying the or each deflection coil in one direction and the other. A control apparatus may be provided for enabling modification of the relative supply times in each direction of the or each coil, so that the welding power and consequently the penetration of the welding beam can be distributed unequally along the internal circumference of contact of the two tubes. Particularly in the case of the welding of horizontal tubes, it is thus possible to adapt the penetration to the instantaneous position in space of the operating zone of each deflection means. Such internal welding will generally be combined with external welding.

An embodiment of the welding machine according to the invention will now be described, by way of example only, with reference to the accompanying drawings.

Figure 1:
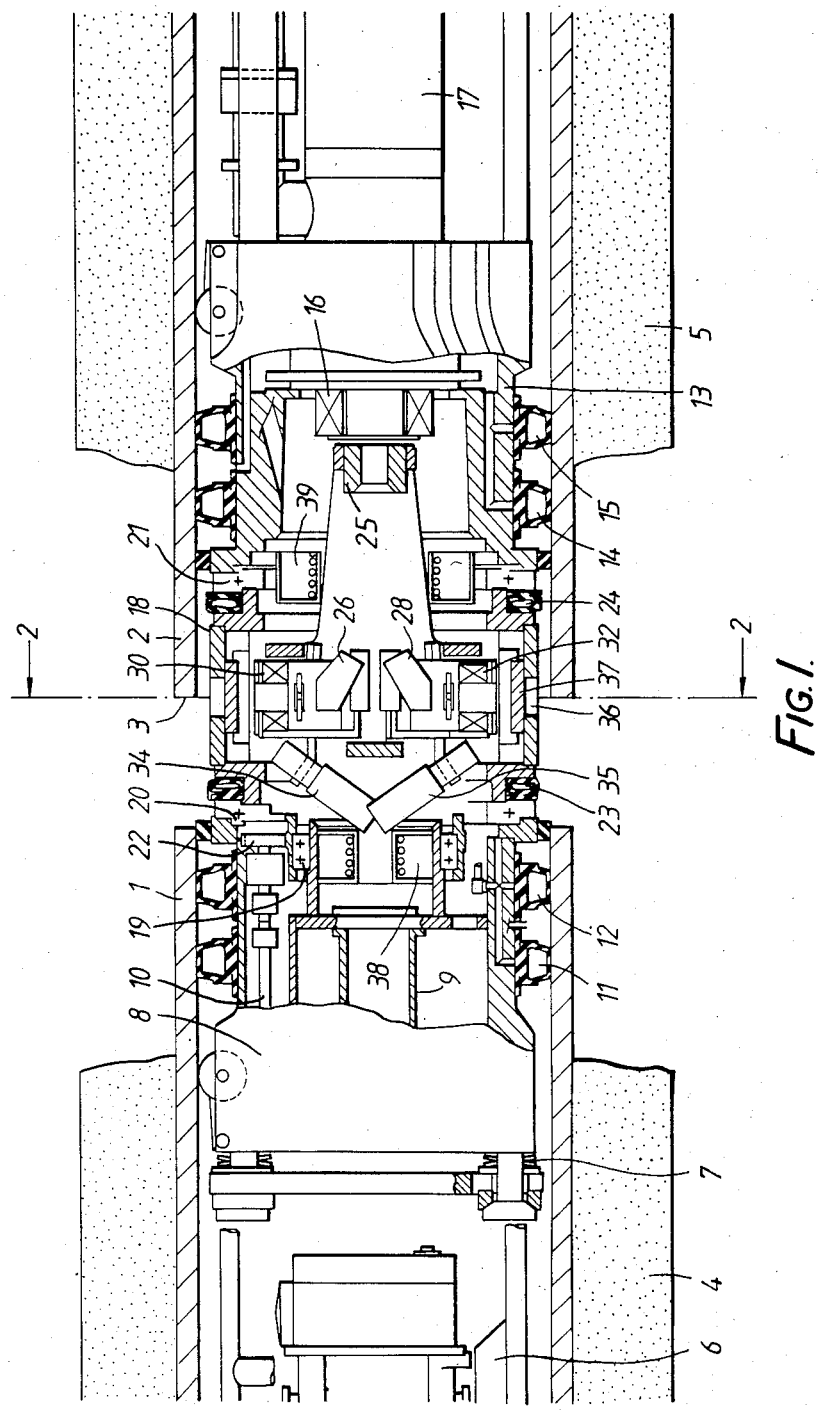
FIG. 1 is a view in elevation and partial section of an embodiment of a welding machine according to the invention installed inside tubes which are to be welded together.

FIG. 1 shows two tubes 1 and 2 which have been brought close together with their ends facing one another. For welding the right-hand end of the tube 1 is brought to abut against the left-hand end of the tube 2 along a plane annular contact surface 3. The tubes 1 and 2 are as shown provided with a concrete covering 4, 5, except in the welding zone.

An electron-beam welding machine has been installed inside the tubes 1 and 2, only the central portion, essential for an understanding of the invention, of the machine being shown. The machine comprises a series of carriages adapted to move inside tubes of a determined diameter. On the left in FIG. 1 can be seen a part of a carriage 6 containing a pumping unit for use in establishing a vacuum in the operative part of the welding machine and connected by an elastic connection 7 to a first central structure 8, through which extends a pumping pipe 9 connecting the pumping unit to the operative part of the welding machine to be evacuated, which contains a shaft 10 for transmitting a rotational movement generated by a motor (not shown), and which is provided with inflatable annular seals 11, 12. On the right in FIG. 1 there is a second central structure 13 which carries inflatable annular seals 14, 15 and an axial focussing lens 16 which is situated downstream (referring to the path of the electron beam) of an electron gun 17.

Figure 2:
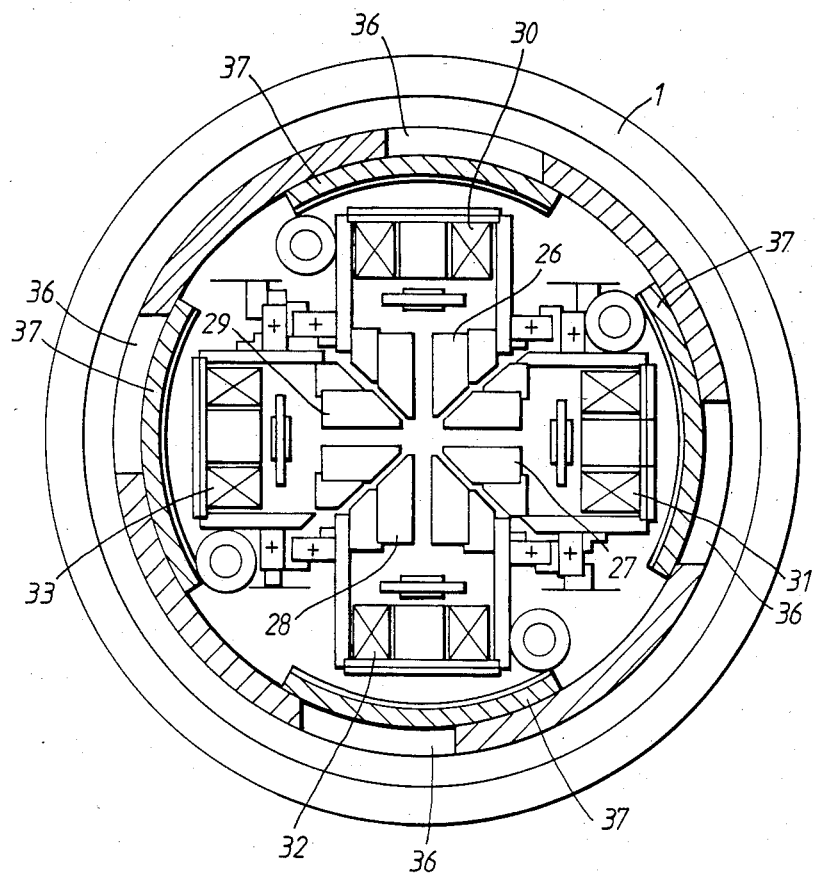
FIG. 2 is a view in section on the line 2—2 in FIG. 1.

Between the central structures 8 and 13, a rotary support 18 is provided which is adapted to rotate in bearings 19, 20 and 21 carried respectively by the structure 8 and the structure 13, and which is driven by the shaft 10 with the interposition of a mechanical transmission 22. Sealing between the rotary support 18 and the structures 8 and 13 is achieved by means of annular seals 23 and 24. The rotary support 18 carries a deflection system 25 disposed facing the axial focussing lens 16, an assembly of four magnetic prisms 26, 27, 28, 29, shown in FIG. 2, relatively angularly spaced apart by 360°/4 for deflection of the electron beam in a radial direction, and four radial focussing lenses 30, 31, 32, 33 each associated with a respective one of the prisms. In addition, the rotary support 18 carries aiming cameras, such as cameras 34 and 35 in FIG. 1, permitting location of the plane of the contact surface 3. The information received from the cameras is used for the positioning of the prisms. The rotary support 18 is provided with four holes 36 for the radial passage of the electron beam. Holes 36 can be closed by slide valves 37. Cable carrier chains 38 and 39 have been provided in the central structures 8 and 13 to permit electrical connections to the rotary support 18.

Figures 3, 4:
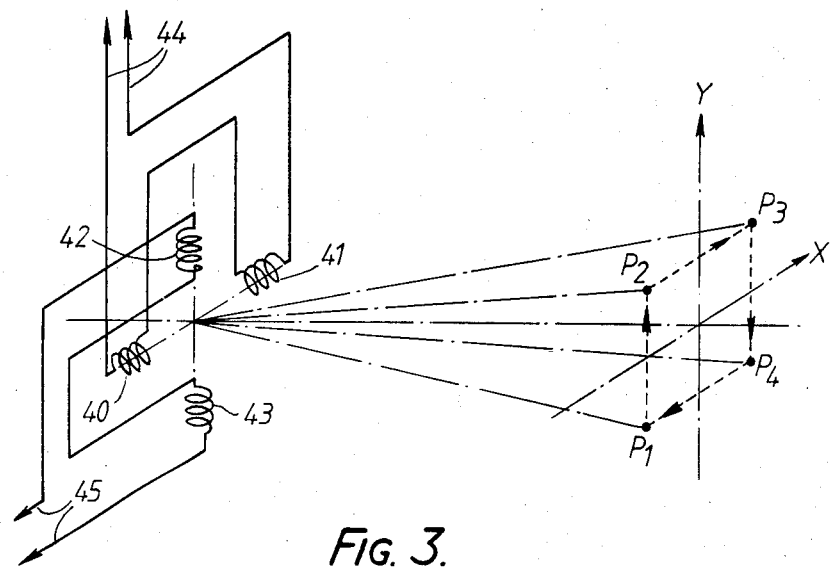
FIG. 3 is a schematic representation of the deflection system of the machine of FIG. 1.
FIG. 4 shows the supply table of the deflection system.
Figure 5:
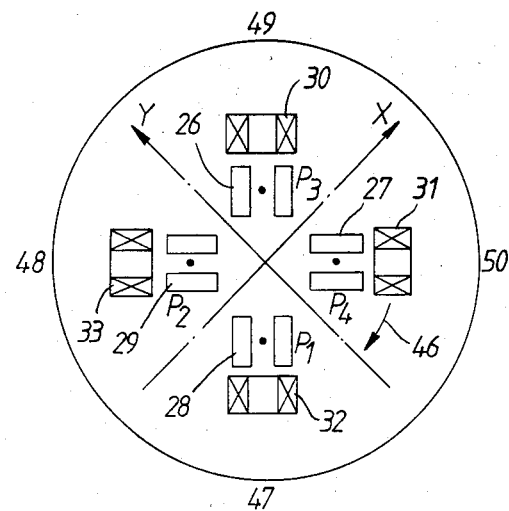
FIG. 5 is a schematic representation of the position in space of the deflection means and the deflection axes of the deflection system.

The deflection system 25 is schematically illustrated in FIG. 3. It comprises a coil composed of two elementary coils 40, 41 effecting deflection along an axis X perpendicular to the axis of the electron gun, and a coil composed of two elementary coils 42 and 43 effecting deflection along an axis Y perpendicular to the axis X and to the axis of the electron gun. The coils 40 and 41 are supplied by conductors 44, and the coils 42 and 43 are supplied by conductors 45. A current circulates in the coils 40 to 43 alternately in one direction and in the opposite direction and having a strength determined in accordance with the acceleration voltage of the electrons in the electron gun 17 in order to obtain a composite deflection of the beam on the axes X and Y which brings the electron beam to one of the four sites $P_1$, $P_2$, $P_3$, $P_4$ defined respectively by the positions of the deflection prisms 28, 29, 26, 27. The table in FIG. 4 shows that one of the sites $P_1$, $P_2$, $P_3$, $P_4$ towards which the electron beam is directed, depending on the direction of the supply current in the coils 40 and 41 for deflection on axis X and in the coils 42 and 43 for deflection on axis Y. FIG. 5 shows the respective positions of the deflection prisms and of the radial focussing lenses in relation to the axes X and Y, the arrow 46 indicating the direction of rotation of the rotary support 18.

Figure 6:
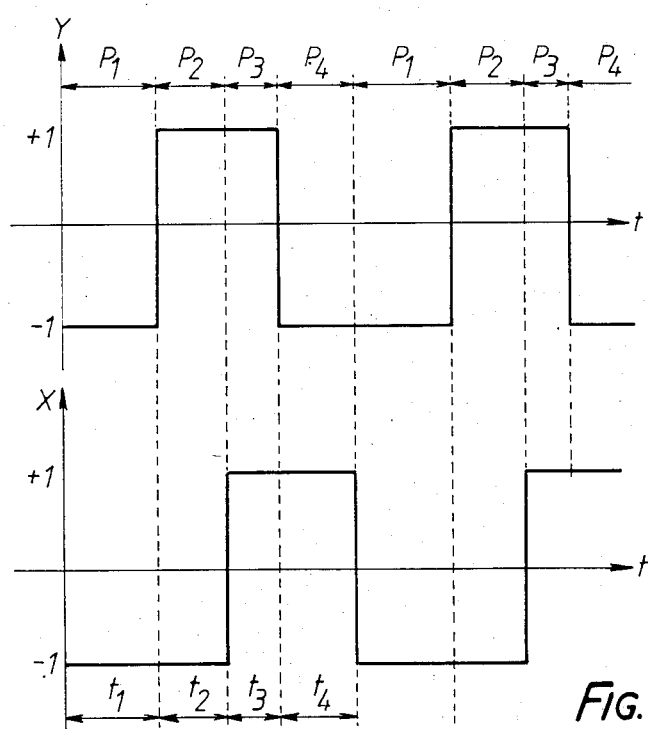
FIG. 6 shows the rectangular supply pulses of the deflection system.

The deflection coils 40 to 43 are supplied with rectangular pulses, as illustrated in FIG. 6. In this Figure it can be seen that the rectangular pulses have given durations in each alternation and are offset in time between the pulses for deflection on axis X and on axis Y such that different utilization times $t_1$, $t_2$, $t_3$, $t_4$ obtained for each of the prisms 28, 29, 26, 27 in a cycle. With the rotary support 18 turning at least a quarter of a turn (with four magnetic prisms) to make a complete internal weld, the power transmitted by each of the prisms in the course of the rotation is varied by controlling the times $t_1$, $t_2$, $t_3$, $t_4$ in order to modify the penetration of the electron beam into the tubes to be welded, depending on whether the beam transmitted by a deflection prism is in the flat welding position (zone 47 in FIG. 5), in the rising position (zone 48 in FIG. 5), in the ceiling position (zone 49 in FIG. 5), or in the descending position (zone 50 in FIG. 5).

Figure 7:
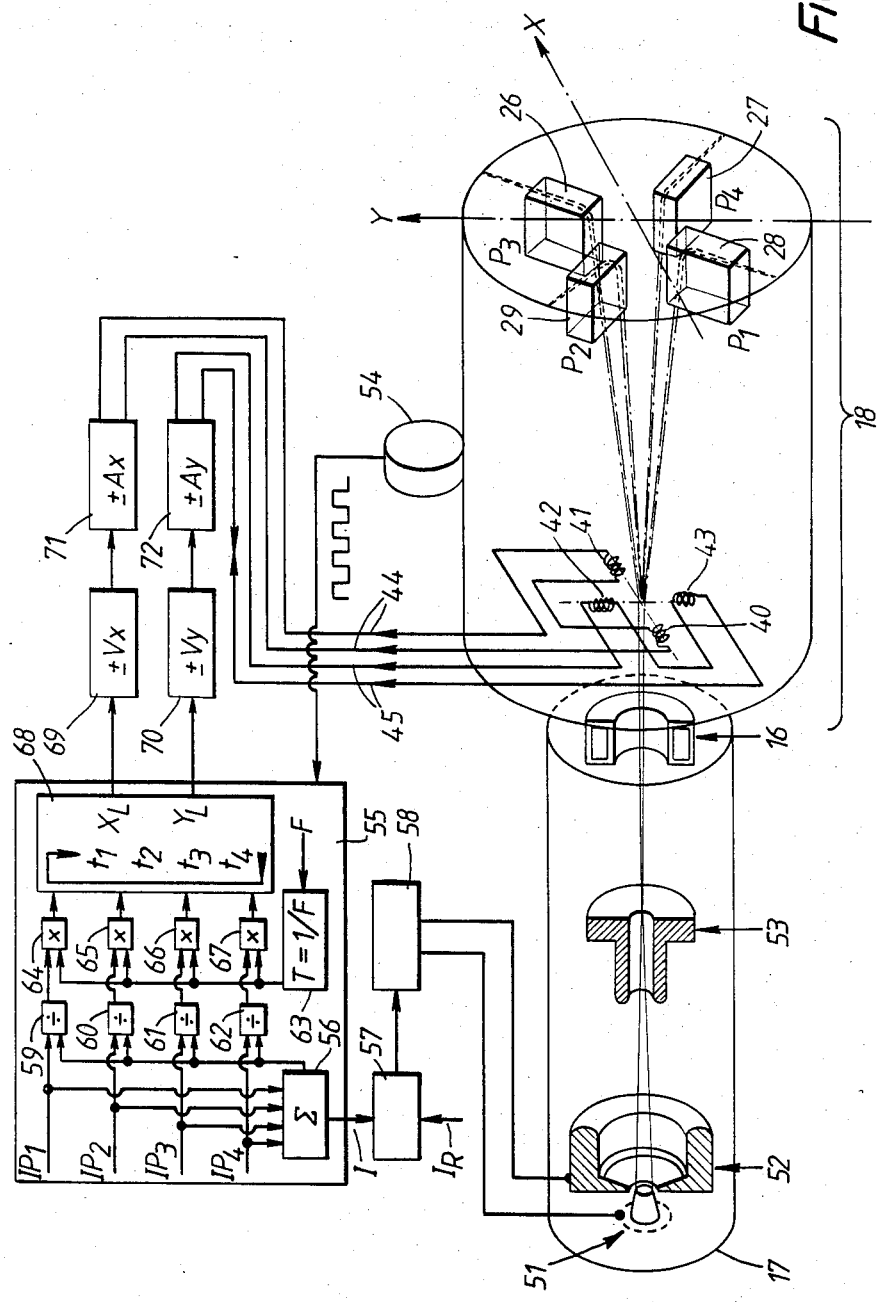
FIG. 7 shows synoptically a control system applied to the welding machine of FIG. 1 for controlling its welding parameters.

The control system will now be described with reference to FIG. 7, which shows the electron gun 17 comprising a cathode 51, a Wehnelt electrode 52 and an anode 53, the focussing lens 16, and the rotary support 18 with the deflection system 40 to 43 and the deflection prisms 26 to 29.

An incremental coder 54 detects the angular position of the rotary support 18 and transmits corresponding information to a programmed microprocessor control apparatus 55. This information may in particular consist of a number of pulses 1 to m in dependence on the rotation of the rotary support 18. The apparatus 55 has in its memory the desired values for each number of these pulses, of the currents $IP_1$, $IP_2$, $IP_3$, $IP_4$ for the electron beam when deflected respectively by the prisms 28, 29, 26, 27. These values are introduced into a summer 56, which gives the value of the total current I which must be delivered by the electron gun 17 at a given moment. This total current I is compared in a comparator 57 with the actual measured current $I_R$ delivered by the electron gun 17. The result of this comparison controls a regulator 58 which regulates the polarization of the Wehnelt electrode 52 in order to ensure equality between I and $I_R$.

The summer 56 also transmits the value of the desired total current I to the input of four dividers 59 to 62, which also each receive one of the desired values of the currents $IP_1$, $IP_2$, $IP_3$, $IP_4$, while each of them gives at its output the fraction of the total current I represented by this value $IP_1$, $IP_2$, $IP_3$, $IP_4$.

Depending on the selected appearance frequency F, which may for example be at least one thousand cycles per second, of a complete cycle of commutations between the four prisms 26 to 29, an inverter 63 calculates the duration T of this cycle: $T = 1/F$, and transmits it to multipliers 64 to 67, which also receive the value of the fraction calculated in one of the dividers 59 to 62. These multipliers 64 to 67 thus supply to a transformation means 68 the times $t_1$, $t_2$, $t_3$, $t_4$ during which, in a cycle having a duration T, each of the prisms 28, 29, 26 and 27 is rendered operative by the deflection of the electron beam in the direction of its site $P_1$, $P_2$, $P_3$, $P_4$. The table in FIG. 4 shows the direction of the current in the suppy conductors 44 and 45 during these successive times $t_1$, $t_2$, $t_3$, $t_4$. The transformation means 68 thus establishes a logic output $X_L$ and a logic output $Y_L$ such that:

during the time $t_1$: $X_L = 0$ $Y_L = 0$
during the time $t_2$: $X_L = 0$ $Y_L = 1$
during the time $t_3$: $X_L = 1$ $Y_L = 1$
during the time $t_4$: $X_L = 1$ $Y_L = 0$ Means for digital to analog conversion and for voltage feedback control, designated respectively 69 and 70, receive respectively the logic values $X_L$ and $Y_L$ and bring into correspondence with them voltages $\pm V_x$ or $\pm V_y$ depending on whether the logic value is 0 or 1. Amplifiers 71 and 72, controlled by voltages $\pm V_x$ and $\pm V_y$ respectively, supply respectively currents $\pm A_x$ and $\pm A_y$ which supply the conductors 44 and 45 respectively.

In the above described embodiment four deflection prisms are provided but it will be clear that any number n, at least equal to two, may be provided angularly spaced apart by $360°/n$, the control system being adapted to n deflection prisms. For four deflection prisms, numerous variants of the control system can also be adopted.

There is thus provided a machine in which 360° rotation of the support of the deflection means which deflects the electron beam from the axial direction to a radial direction, is replaced by a rotation of only a fraction of 360°.

What is claimed is:

1. A machine for the electron-beam internal welding of two tubes disposed coaxially end-to-end comprising a fixed electron gun for emitting an axial electron beam, deflection means for deflecting said electron beam in the radial direction, and a rotatable support carrying said deflection means and adapted to rotate about an axis coinciding with the axis of said tubes, wherein said rotatable support carries a number n, which is at least equal to two, of said deflection means arranged so as to deflect the electron beam in different radial directions spaced 360/n degrees apart, and, upstream of said deflection means, a deflection system adapted to deliver in a cycle the axial electron beam emitted by said electron gun successively to each of said n deflection means, at a high rate.

2. A machine according to claim 1, wherein said deflection system is adapted to deliver the electron beam to each deflection means at least one thousand times per second.

3. A machine according to claim 1, wherein said deflection system comprises at least one deflection coil and supply conductors for supplying said deflection coil or coils in one direction or the other, control apparatus being provided for enabling modification of the relative supply times in each direction of said deflection coil or coils in each said cycle.

4. A machine according to claim 3, including an incremental coder controlled by the angle of rotation of said rotary support and for supplying information regarding said angle to said control apparatus, said control apparatus being adapted to determine said relative supply times in accordance with said information.

* * * * *